(12) United States Patent
Isbill (10) Patent No.: US 12,046,878 B2
(45) Date of Patent: Jul. 23, 2024

(54) COVER EXTENSION FOR ELECTRICAL PANEL

(71) Applicant: Bryan Joseph Isbill, Bethlehem, GA (US)

(72) Inventor: Bryan Joseph Isbill, Bethlehem, GA (US)

( * ) Notice: Subject to any disclaimer, the term of this patent is extended or adjusted under 35 U.S.C. 154(b) by 281 days.

(21) Appl. No.: 17/741,606

(22) Filed: May 11, 2022

(65) Prior Publication Data

US 2022/0271514 A1 Aug. 25, 2022

Related U.S. Application Data (63) Continuation-in-part of application No. 17/177,113, filed on Feb. 16, 2021, now Pat. No. 11,936,167.

(60) Provisional application No. 63/141,457, filed on Jan. 25, 2021.

(51) Int. Cl.
  *H02B 1/44* (2006.01)
  *H02B 1/40* (2006.01)
  *H05K 5/03* (2006.01)

(52) U.S. Cl.
  CPC ............. *H02B 1/40* (2013.01); *H05K 5/03* (2013.01)

(58) Field of Classification Search
  CPC . H02B 1/44; H02B 1/052; H02B 1/40; H02B 1/42; H02B 1/46; H02B 1/48; H02B 1/044; H02G 3/08; H02G 3/081; H02G 3/14; H02G 3/10; H02G 3/12; H05K 5/03; H05K 5/0217
  USPC ......... 174/50, 480, 481, 53, 57, 66, 67, 542, 174/535, 58; 220/3.2, 3.3, 3.8, 241, 242; 439/535, 536
  See application file for complete search history.

(56) References Cited

U.S. PATENT DOCUMENTS

| D261,135 S | 10/1981 | Horne |
| 4,297,525 A * | 10/1981 | Bowden, Jr. ........... H02G 3/123 |
| | | 220/3.6 |
| 4,979,633 A | 12/1990 | Lakey |

(Continued)

FOREIGN PATENT DOCUMENTS

| EP | 3276108 A1 | 1/2018 |
| FR | 2546560 A1 | 5/1983 |
| JP | H0711516 Y2 | 9/1989 |

OTHER PUBLICATIONS

"Loadcenters and Circuit Breakers", www.eaton.com, vol. 1—Residential and Light Commercial, First aware of in Jun. 2022 (dated "Apr. 2019" but no knowledge or admission of that being correct), p. 1.

*Primary Examiner* — Angel R Estrada
(74) *Attorney, Agent, or Firm* — Perilla Knox & Hildebrandt LLP (57) ABSTRACT

A cover extension can be installed above or below a wall-mounted electrical panel (e.g., a circuit breaker panel) to cover an opening in the wall immediately above or below the panel. The cover extension includes a panel member, a bottom flange, and two top couplings and stop members. The flange extends downwards from the panel member bottom and is offset from the panel member so that it can fit behind the panel cover of the electrical panel to secure the cover extension bottom to the panel cover. The mechanical stops (e.g., brackets) are located on the panel member rear face and configured to each cause the respective coupling member on the panel member rear face to engage the cover extension to secure the cover extension top to the wall.

20 Claims, 9 Drawing Sheets

(56) References Cited

U.S. PATENT DOCUMENTS

| | | | |
|---|---|---|---|
| 6,241,368 B1 * | 6/2001 | Depino | F21V 21/04 |
| | | | 362/147 |
| 6,683,247 B1 * | 1/2004 | McTavish | H02G 3/14 |
| | | | 174/45 R |
| 6,686,540 B2 | 2/2004 | Compagnone, Jr. | |
| 7,468,487 B1 * | 12/2008 | Murphy | H02G 3/14 |
| | | | 220/3.6 |
| 7,759,576 B1 * | 7/2010 | Gretz | H02G 3/123 |
| | | | 439/535 |
| 8,445,779 B1 * | 5/2013 | Gretz | H02G 3/123 |
| | | | 174/53 |
| 8,720,156 B2 * | 5/2014 | Porter | F16B 21/09 |
| | | | 52/127.9 |
| 9,453,616 B2 | 9/2016 | Myers et al. | |
| 9,611,879 B2 * | 4/2017 | DeCosta | F16B 13/0833 |
| 11,936,167 B2 * | 3/2024 | Isbill | H02B 1/052 |

* cited by examiner

COVER EXTENSION FOR ELECTRICAL PANEL

CROSS REFERENCE TO RELATED APPLICATIONS

The present application is a continuation-in-part of U.S. Non-provisional patent application Ser. No. 17/177,113, filed Feb. 16, 2021, which claims the priority benefit of U.S. Provisional Patent Application No. 63/141,457, filed Jan. 25, 2021, the entireties of which are hereby incorporated by reference herein for all purposes.

TECHNICAL FIELD

The present invention relates to electrical enclosures installed flush into walls, and more particularly, to a cover extension for an electrical panel for covering a wall opening adjacent the electrical enclosure.

BACKGROUND

An electrical circuit breaker panel, also known as a distribution board, is the main distribution point for electrical circuits in a home. A typical breaker panel in a United States' home includes a cabinet box or enclosure that is mounted inside a 16 inch on center, 2×4 stud wall. The cabinet box is usually made of sheet metal. The cabinet box which includes the wiring, circuit breakers, and termination points, is covered by a panel cover. The panel cover is installed flush with the drywall or other wall coverings, covering/hiding the cabinet box and its internal components. The panel cover often includes a door to gain access to the circuit breakers.

Later, after installation, it is common to have modifications in the wiring of the breaker panel. The modification can be adding new wires or replacing the old ones. Wires are usually added into the panel from above or below, into the wall and travel to different electrical points in a building. Adding or removing a wire in a breaker panel is difficult, time consuming, and generally requires cutting off a section of the drywall above or below the breaker panel. First, the panel cover is removed and then a section of the drywall is cut-off for gaining access to the breaker panel. After completion of the job, the section of the drywall can be repaired.

However, the repairing of the drywall is both a laborious and time-consuming job. Moreover, the patching of the drywall is not always perfect and can look odd and imperfections may be there. Since later modifications in wiring after installations are common and may be frequent, a long-standing need is there for a cover that can hide the cutouts, patches, or imperfections in drywall immediately above or below a breaker panel.

SUMMARY

The following presents a simplified summary of one or more embodiments of the present invention in order to provide a basic understanding of such embodiments. This summary is not an extensive overview of all contemplated embodiments and is intended to neither identify key or critical elements of all embodiments nor delineate the scope of any or all embodiments. Its sole purpose is to present some concepts of one or more embodiments in a simplified form as a prelude to the more detailed description that is presented later.

In one aspect, disclosed is a breaker panel cover extension that can be installed above or below a breaker panel and can hide imperfections or openings in drywall immediately above or below the breaker panel. The disclosed cover extension can include a panel member having a proximal end and a distal end. The panel member can have a top edge, a bottom edge, a left edge, and a right edge defining an area of the panel member. The panel member having a front face and a rear face. A thin and narrow downward flange extends downwards from the bottom edge and away from the panel member. The thin and narrow flange can extend along the length of the bottom edge. In one case, the thin and narrow flange is slightly offset rearwardly which can tuck behind the panel cover of the breaker panel. In one case, the thin and narrow flange is continuous with the rear face of the panel member. The distal end of the panel member, near the top edge, can have two or more brackets wings or zip-mount retainers integrated on its rear face. The bracket wings hold the cover extension tight to the wall.

In one aspect, the panel member can have a curved flange that extends along the periphery of the panel member and curves rearwardly. The thin and narrow bottom flange extends downwards from the lower end periphery of the curved flange. The brim of the curved flange and the rear face of the bottom flange can be coplanar.

In one aspect, the bracket can be an L-shaped bracket having two protruding legs i.e., an upper leg and a side leg, on the rear face of the panel member. At the intersection of the two legs of the bracket, between the two legs, can be a hole in the panel member. A flip tab can be coupled to the panel member through a fastener that runs through the hole in the panel member. The head of the fastener is on the front face of the panel member while the shank of the fastener freely passes through the hole. The shank having threads along its length. The flip tab can be of a narrow and elongated geometry its one end configured as a screw, wherein the inner surface of the screw is having threads configured to threadedly engage with the threads of the shank. Clockwise rotation of the fastener can turn the flip tab clockwise, while the upper leg of the bracket restricts the clockwise rotation of the flip tab, wherein the upper leg points towards the upper edge of the panel member. The anticlockwise rotation of the fastener can rotate the flip tab anticlockwise while the side leg of the bracket limits the anticlockwise rotation of the flip tab. Thus, the flip tab can rotate 90 degrees between the two legs of the bracket.

These and other objects and advantages of the embodiments herein will become readily apparent from the following detailed description taken in conjunction with the accompanying drawings.

BRIEF DESCRIPTION OF THE DRAWINGS

The accompanying figures, which are incorporated herein, form part of the specification and illustrate embodiments of the present invention. Together with the description, the figures further explain the principles of the present invention and to enable a person skilled in the relevant arts to make and use the invention.

DETAILED DESCRIPTION OF EXAMPLE EMBODIMENTS

Subject matter will now be described more fully hereinafter with reference to the accompanying drawings, which form a part hereof, and which show, by way of illustration, specific exemplary embodiments. Subject matter may, however, be embodied in a variety of different forms and, therefore, covered or claimed subject matter is intended to be construed as not being limited to any exemplary embodiments set forth herein; exemplary embodiments are provided merely to be illustrative. Likewise, a reasonably broad scope for claimed or covered subject matter is intended. Among other things, for example, the subject matter may be embodied as methods, devices, components, or systems. The following detailed description is, therefore, not intended to be taken in a limiting sense.

The word "exemplary" is used herein to mean "serving as an example, instance, or illustration." Any embodiment described herein as "exemplary" is not necessarily to be construed as preferred or advantageous over other embodiments. Likewise, the term "embodiments of the present invention" does not require that all embodiments of the invention include the discussed feature, advantage, or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The following detailed description includes the best currently contemplated mode or modes of carrying out exemplary embodiments of the invention. The description is not to be taken in a limiting sense but is made merely for the purpose of illustrating the general principles of the invention, since the scope of the invention will be best defined by the allowed claims of any resulting patent.

Disclosed is an electrical panel cover extension that can be installed above or below an electrical panel. The cover extension is described herein for use with a circuit breaker panel installed flush mounted into drywall, though persons of ordinary skill in the art will understand the cover extension can be used with other electrical panels that are installed inset into (and generally flush with) walls or other surfaces, including walls made of sheetrock and/or other materials. The cover extension can be used to cover/conceal a wall opening adjacent an electrical enclosure/panel, when the wall opening has been formed in the wall to gain access to the electrical panel and/or wires, and at the same time hide imperfections in the wall and/or opening. More particularly, the cover extension can be used to hide cut-outs/openings in the drywall immediately above or below the breaker panel. Such cut-outs/openings in the drywall can be made to add wires into the panel. The cover extension can have an aesthetic appearance that can blend-in with the existing cover of the breaker panel or the surrounding wall.

Figure 1:
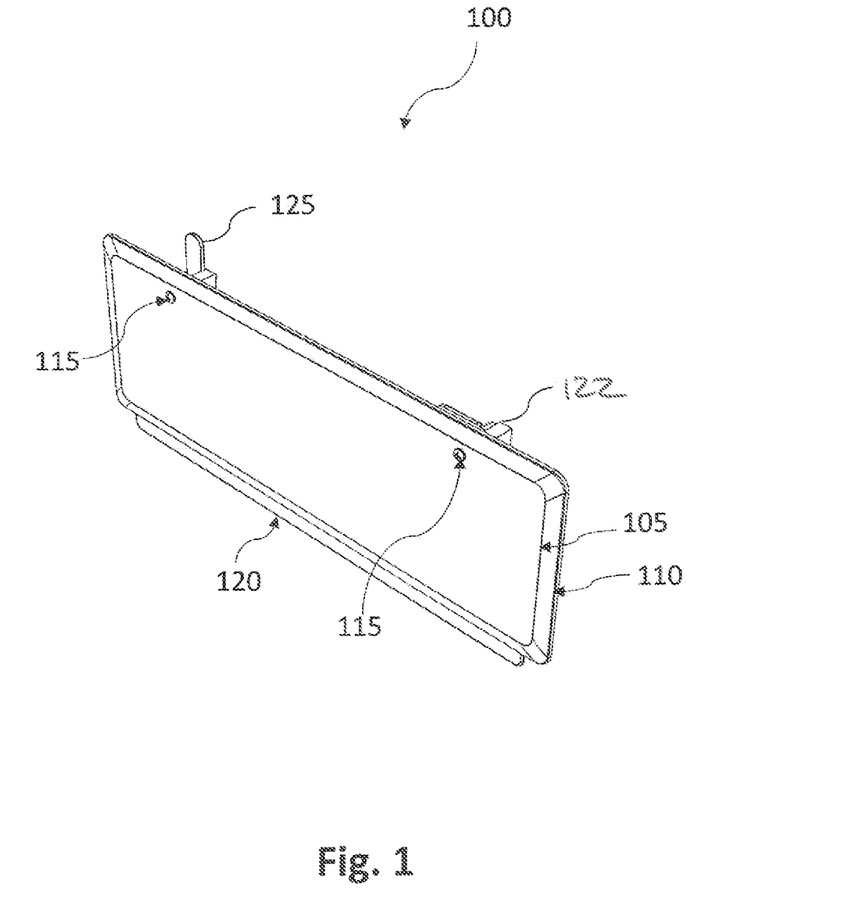
FIG. 1 is a front perspective view of a breaker panel cover extension according to a first exemplary embodiment of the present invention.

Referring to FIG. 1, which shows a first exemplary embodiment of the cover extension 100, the cover extension includes a panel member 105 that can be of planar geometry. The panel member can also have a slightly curved geometry. The length of the panel member can be proportional to the width of a panel cover of a breaker panel. The panel member can be made from a sheet of a rigid material, such as plastics or metal. For example, the panel member can be molded from plastic material or metal sheets. The front face of the panel member can be provided with an aesthetic appearance, such as a color shade or pattern. For example, the color shade of the panel member can match with the existing panel cover of the breaker panel. FIG. 1 also shows a bevel 110 (e.g., curved) that extends rearwardly from the periphery of the panel member 105. Such a curved bevel can be optional, but if present can have a front face continuous with the front face of the panel member 105. The curved bevel can be coupled to the periphery of the panel member or the curved bevel 110 and the panel member 105 can be integral. The curvature of the bevel 110 can be a quarter circle. Two screw heads 115 can also be seen on the front face of panel member 105.

Figure 2:
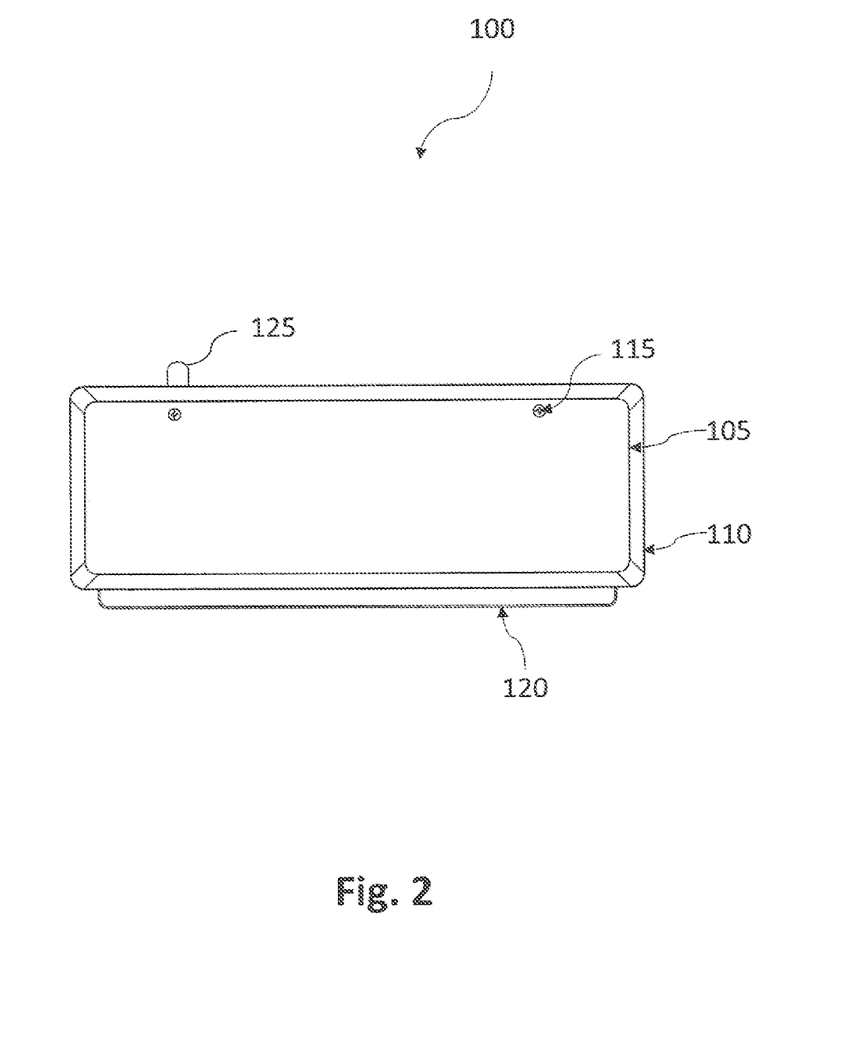
FIG. 2 is a front view of the cover extension of FIG. 1.

The panel member can have a top edge, a bottom edge, a left edge, and a right edge defining an area of the panel member. The panel member having a front face shown in FIG. 2 and a rear face shown in FIG. 5. The two screw heads 115 are near the top edge of the panel member 105. At the bottom edge of the panel member 105 can be seen a thin and narrow bottom flange 120 that extends downwards from the bottom edge and away from panel member 105. The thin and narrow bottom flange 120 can extend along the length of the bottom edge, as depicted. Alternatively, the bottom flange can be provided by a series (two or more) of fingers, tabs, or other retaining members or crenellations. Further alternatively or additionally, the bottom flange can be provided by a flexible clip (i.e., a living hinge) instead of a rigid flange.

Figure 3:
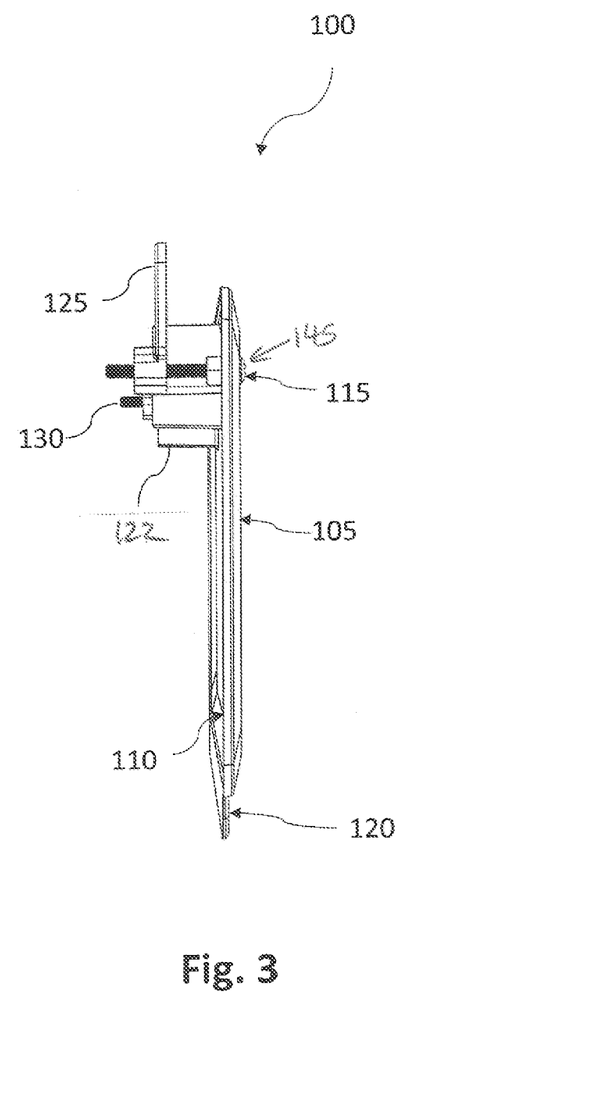
FIG. 3 is a side view of the cover extension of FIG. 1.

The thickness of the bottom flange can be more clearly seen in FIG. 3, which shows the side view of the cover extension 100. The bottom flange 120 and the panel member 105 can be integral. While installing the disclosed cover extension 100 over drywall and above or below a breaker panel, the bottom flange 120 can be positioned behind a panel cover of the breaker panel. FIG. 3 shows the bottom flange 120 continuous with the brim of the curved bevel 110. The curved bevel 110 and the bottom flange 120 can be integral. As described above, the curved bevel 110 can be optional and in absence of the curved bevel 110, the bottom flange 120 can be continuous with the rear face of the panel member but thinner than the panel member. Alternatively, the bottom flange can be slightly offset rearwardly so that the front surface of the cover extension 100 is generally co-planar with the front surface of the cover of the breaker panel. The length of the bottom flange can be the same or lesser than the width of the panel cover of the breaker panel.

Figure 4:
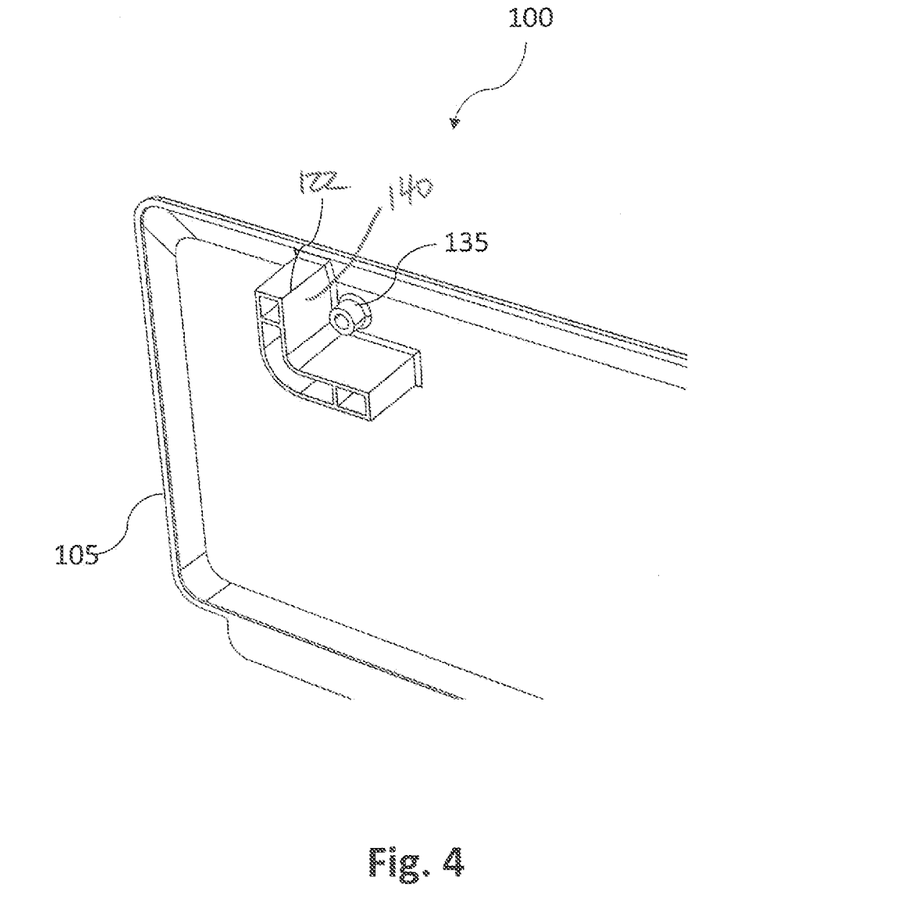
FIG. 4 is a rear perspective view of a portion of the cover extension of FIG. 1. showing a mechanical-stop bracket on a rear face of the cover extension.
Figure 5:
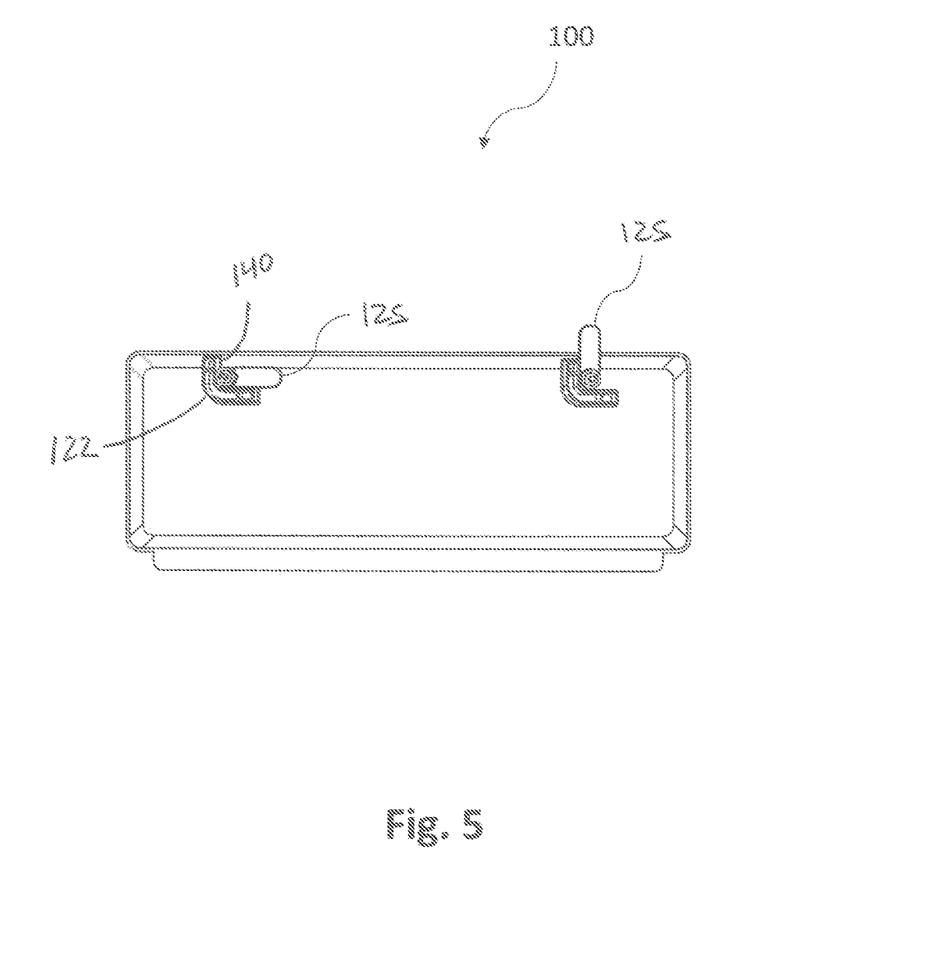
FIG. 5 is a rear view of the cover extension of FIG. 1, showing a left flip tab in an unlocked/unengaged position and a right flip tab in a locked/engaged position.
Figure 6:
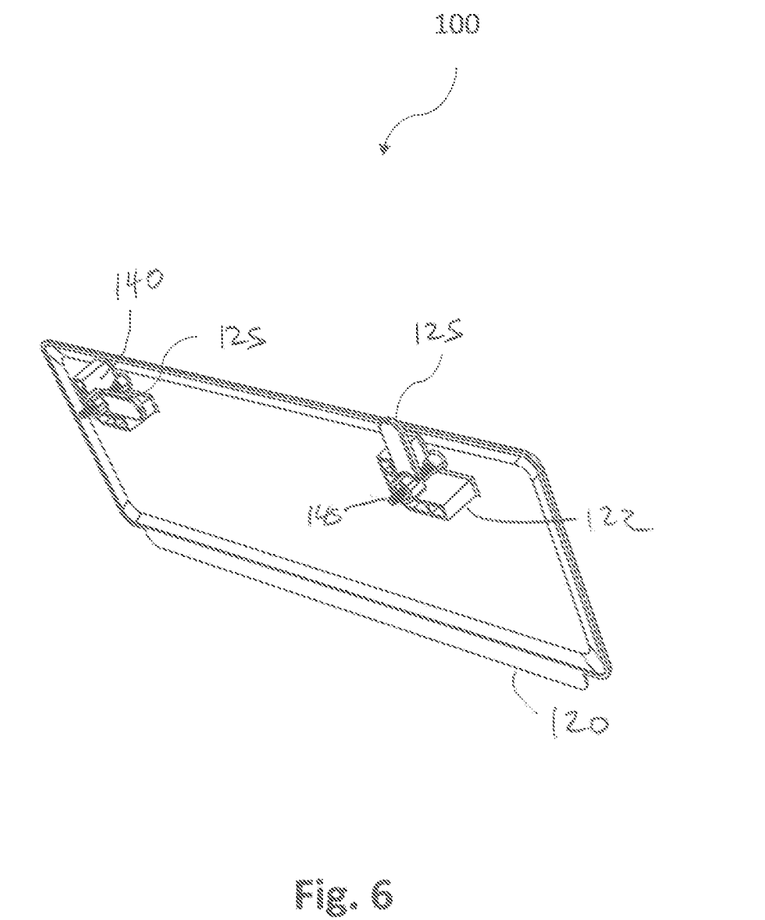
FIG. 6 is a rear perspective view of the cover extension of FIG. 5.
Figure 7:
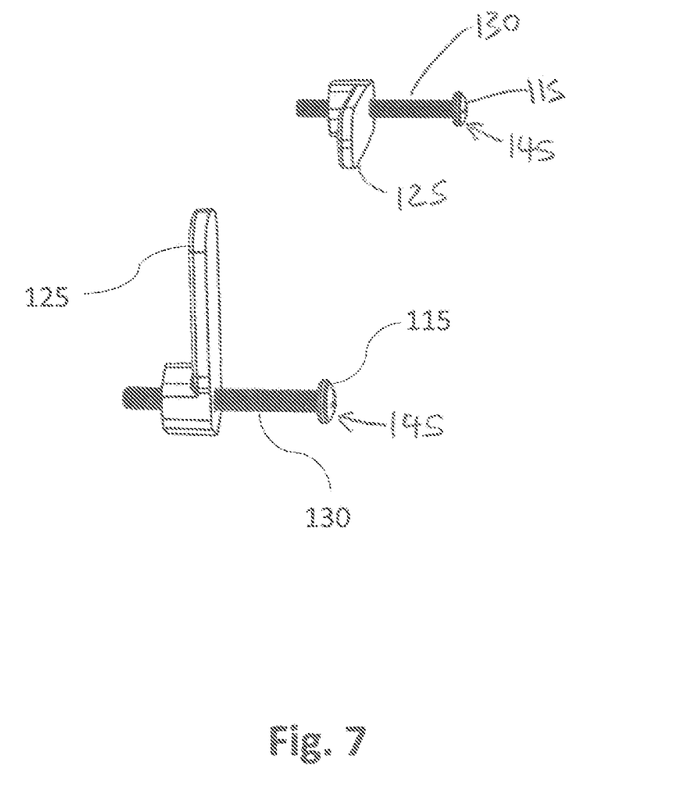
FIG. 7 is a perspective view of the flip tabs with the threaded fasteners of FIG. 5.

FIG. 4 shows a close-up view of a bracket 122 coupled on a rear face of the panel member 105. Bracket 122 can be of an L-shaped profile having two legs, an upper leg and a side leg. The upper leg points towards the top edge of the panel member while the side leg points towards the right edge of the panel member. The two legs of bracket 122 shown in FIG. 4 is curved and continues, but a sharp intersection of the two legs can also be possible, without departing from the scope of the present invention. The bracket 122 can be protruding perpendicularly from the rear face of the panel member. The bracket 122 can be coupled to a surface of the panel member 105 or the bracket and the panel member can be integral. Two or more of such brackets can be provided on the rear face and near the top edge of the panel member 105. FIGS. 5 and 6 show two spaced brackets below the top edge of the panel member on its rear surface.

The bracket 122 includes a stop surface 140 that functions as a mechanical stop, as described in more detail below. The depicted bracket 122 is just one example of many different mechanical stops that can be used, such as bars (see FIG. 11), posts, pegs, and/or other protruding members (with or without an L shape). The L-shaped bracket 122 of the depicted embodiment provides two stop surfaces, with the second stop surface formed on side leg (lateral branch) of the L-shaped bracket 122 to retain the flip tab in a lateral (horizontal) position (as described below with respect to FIG. 5).

Referring to FIG. 4, between the two legs of bracket 122 and adjacent the intersection of the two legs can be a hole in the panel member. A threaded fastener 145 can freely pass through this hole. FIG. 1 shows the head 115 of the fastener 145 retained on the front face of the panel member 105. FIG. 3 shows a threaded shank 130 of the fastener 145. Also, as can be seen in FIG. 4 is an annular elevated sleeve 135. Such a sleeve 135 can be used to increase the distance between the surface of the panel member and the flip tab 125. In case, the panel member is having the curved bevel 110, the sleeve 135 may be needed, wherein the height of the sleeve 135 can be proportional to the height of the curved bevel 110.

FIG. 6 shows two spaced coupling members on the rear face of the panel member 105. The coupling member can be a flip tab of an elongated, thin, and narrow profile. The flip tabs can be rotated (e.g., at least 90 degrees) between an engaged position and a disengaged position. The flip tabs can be turned upwards to engage with drywall for securing the cover extension 100 to the drywall. FIG. 5 shows the left flip tab 125 extended sidewards against the side leg of the bracket 122 in a disengaged position. The right flip tab 125 is shown extended upwards and abutting against the stop surface 140 defined by the upward leg of the bracket 122 in an engaged position. It is to be understood that drawings show the two flip tabs in upward and sideward position for illustration only, but to mount the cover extension, both the flip tabs can be switched to the engaged portion. Also, the cover extension can have one or more of such brackets and the flip tabs, without departing from the scope of the present invention.

FIG. 6 shows the flip tabs 125 with the fasteners 145. One end of the flip tab 125 can be of a screw profile having inner threads. The inner threads of the flip tab 125 can threadedly engage with the threads of the fastener 145. Clockwise rotation of the fastener brings the flip tab 125 closer towards the surface of the planar member, i.e., the flip tab is moved towards the head of the fastener 145. Opposite (anticlockwise) rotation of the fastener 145 moves the flip tab 125 away from the planar member 105. When the flip tabs 125 can freely rotate, the torque from the rotation of the fastener 145 causes the rotation of the flip tabs 125. In some embodiments, the flip tabs 125 are free to rotate 360 degrees. The fasteners 145 can rotate freely with the flip tabs. The brackets 122 of the depicted embodiment are positioned to limit the rotation of the flip tabs 125 (e.g., up to 90 degrees, between the upper leg stop surface 140 and the side leg of the bracket). When the flip tab 125 is in a sideward position (the unengaged left tab in FIG. 5), not extending beyond the edge of the panel member, rotation of the fastener 145 causes the flip tab to rotate upwards to the engaged position (the right tab in FIG. 5) against the upper leg stop surface 140 of the bracket 122 (extending beyond the edge of the panel member and behind the wall and engaging/es the wall to secure the first edge of the panel member in place). Once the rotation of the flip tab 125 is restricted by the upper leg stop surface 140, the further clockwise rotation of the head 115 of the threaded fastener 145 results in horizontal linear movement of the flip tab towards the panel member until the flip tab engages/contacts the wall to secure the panel member in place. The flip tab 125 thus clamps the flip tab to the drywall to secure the cover extension 100 in place to/over the drywall. Additional details of this flip-tab installation sequence are provided below with respect to FIGS. 12*a-d*. Rotating the fastener 145 anti-clockwise loosens the flip tabs 125, which then rotate back downward to their unengaged positions, and the cover extension 100 can then be removed from the drywall.

In practice, a user wishing to add a new wire to the breaker panel first removes the breaker panel cover. Thereafter, a section of the drywall above or below the breaker panel can be removed (e.g., cut off or out) to form a wall opening adjacent the breaker panel to gain access to the breaker panel. Once the job is completed, the size of the wall opening can be matched to the size of the cover extension 100, so that the brackets 122 and flange 120 fit into the wall opening. Thereafter, the cover extension 100 can be positioned covering/concealing the wall opening above or below the breaker panel, and the breaker panel cover is attached so that it's top covers the bottom flange 120 of the cover extension 100. Thereafter, the screw head of the threaded fastener 145 can be screwed in the clockwise direction for moving the flip tabs 125 to the engaged position clamping the cover extension 100 to the drywall.

Figure 8:
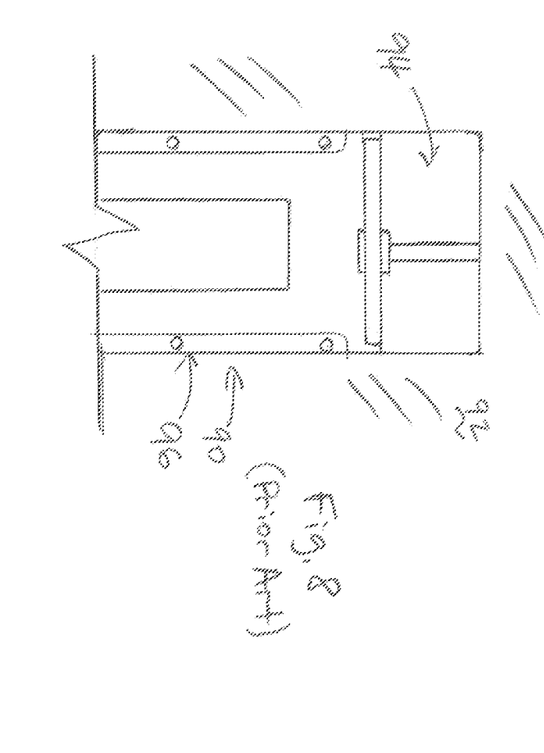
FIG. 8 is a front view of a breaker panel installed on a wall according to the prior art, showing an opening formed in the wall above the breaker panel for rewiring of the breaker panel.
Figure 9:
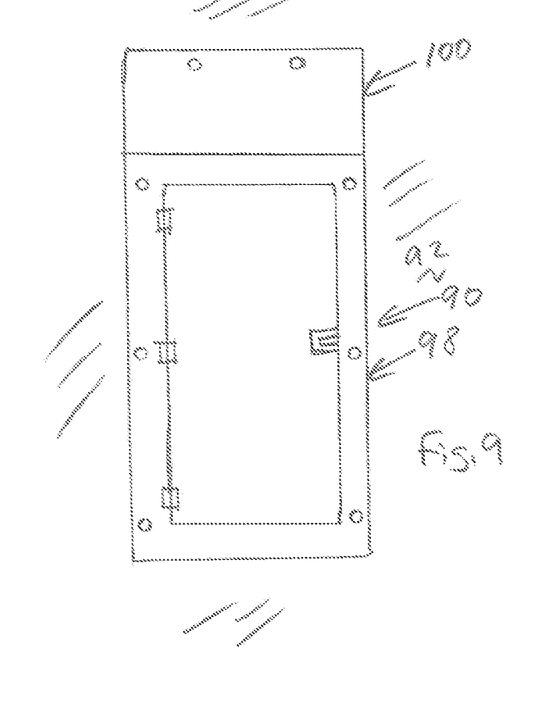
FIG. 9 shows the cover extension of FIG. 1 installed above the breaker panel and covering the wall opening of FIG. 8.
Figure 10:
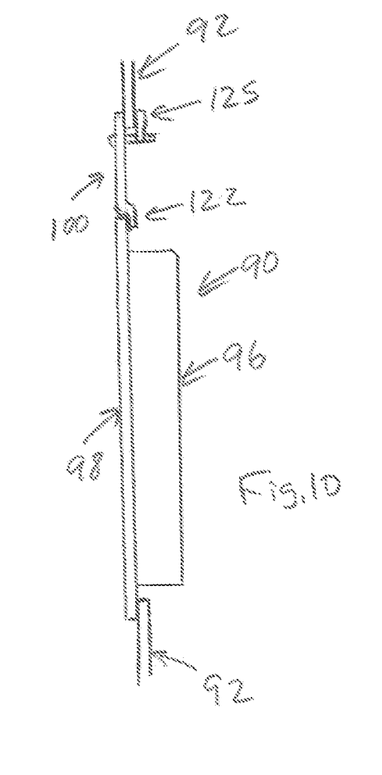
FIG. 10 is a side view of the cover extension, the breaker panel, and the wall of FIG. 9.

FIGS. 8-10 show additional details of the cover extension 100 and its use. FIG. 8 shows a prior art breaker box 96 of a breaker panel 90 installed on a wall 92 according to the prior art, with an opening 94 formed in the wall above the breaker panel for rewiring of the breaker panel. FIG. 9 shows the cover extension 100 installed above the breaker panel 90 and covering the wall opening 94, with the panel cover 98 of the breaker panel 90 installed over the breaker box 96. And FIG. 10 shows the flip tabs 125 and the bottom flange 120 retaining the cover extension 100 securely in place against the breaker panel 90 and the wall 92, with the breaker panel 90 including a breaker box 96 that is inset into the wall 92.

Figure 11:
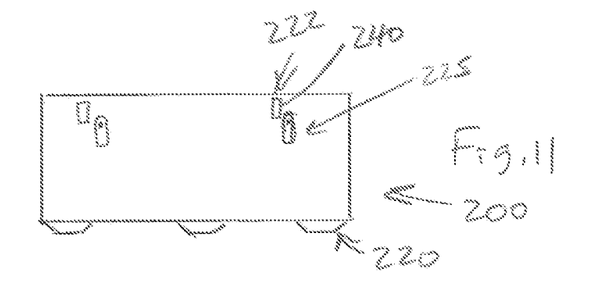
FIG. 11 is a rear perspective view of a breaker panel cover extension according to a second exemplary embodiment.
Figure 12A:
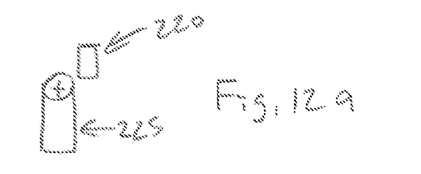
FIGS. 12a-d are schematic views, with FIGS. 12a-c being front schematic views and FIG. 12d being a side schematic view, showing an installation sequence of one of the flip tabs.
Figure 12B:
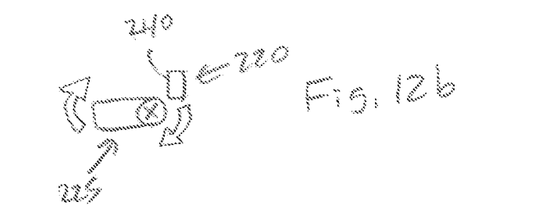
Figure 12C:
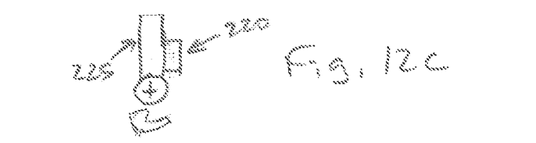
Figure 12D:
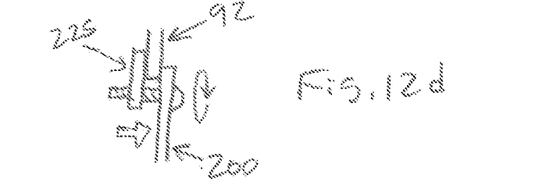

FIG. 11 shows a breaker panel cover extension 200 according to a second exemplary embodiment. The cover extension 200 is similar to that of the first exemplary embodiment, except as noted. In particular, the cover extension 200 includes different mechanical stops 222 (i.e., bars instead of L-shaped brackets) that define the stop surface 240 for the flip tabs 220. In addition, the bottom flange 220 is provided by a series of flange elements (tabs, fingers, or other protruding elements) to provide the same functionality as in the first embodiment FIGS. 12*a-d* show details of the installation sequence of one of the flip tabs 225, which is generally described above for the flip tabs of the first embodiment. In FIG. 12*a*, the flip tab 225 is hanging down by gravity. In FIG. 12*b*, the threaded fastener 145 is rotated in a tightening angular direction (e.g., clockwise), and because of the frictional resistive force between the tab 125 and the fastener 145, the tab 125 rotates along with the fastener 145 (as shown by the two angular directional arrows). In FIG. 12*c*, the threaded fastener 145 and flip tab 125 have been rotated further until the flip tab has come into contact with the stop surface 140, and now the tab 125 is mechanically blocked from further rotation with the fastener 145. Because of the inter-engaging (meshing) threads of the fastener 145 and the tab 125, further rotation of the fastener 145 results in the rotating threads of the fastener and the non-rotating threads of the tab causing the flip tab 145 to be drawn laterally toward and into securing contact with the wall 92, as shown in FIG. 12*d*.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above-described embodiment, method, and examples, but by all embodiments and methods within the scope and spirit of the invention as claimed.

What is claimed is:

1. A cover extension for an electrical panel including an electrical box and a panel cover, the cover extension for covering an opening in of a wall immediately above or below the electrical panel, the cover extension comprising:
   a panel member having opposite first and second edges and having a front face and a rear face;
   a flange that extends away from the second edge of the panel member and is configured to fit behind and be engaged by the panel cover so that the panel cover secures the second edge of the panel member in place;
   at least one mechanical stop extending from the rear face of the panel member and defining at least one stop surface; and
at least one flip tab extending from the rear face of the panel member and swively coupled to the panel member, wherein the flip tab is rotatable between an unengaged position not extending beyond the first edge of the panel member and an engaged position extending beyond the first edge of the panel member, wherein the stop surface limits rotation of the flip tab upon rotation into the engaged position, and wherein in the engaged position the flip tab is behind and engages the wall to secure the first edge of the panel member in place.

2. The cover extension according to claim 1, wherein the flip tab is coupled to the panel member by a threaded fastener having a head retained on the front surface of the panel member and a threaded shank freely inserted through a hole in the panel member, wherein the flip tab has inner threads configured to threadedly engage with the threads of the shank.

3. The cover extension according to claim 2, wherein the hole in the panel member is located adjacent the stop surface.

4. The cover extension according to claim 3, wherein upon the flip tab being rotated into the engaged position, the mechanical stop prevents further rotation of the flip tab in the same direction, wherein further rotation of the fastener in the same direction results in the flip tab being pulled toward the rear face of the panel member by the threadedly engaged fastener and flip tab to clamp the panel member to the wall.

5. The cover extension according to claim 1, wherein the stop surface is formed on an L-shaped bracket that limits rotation of the flip tab between the engaged and unengaged positions.

6. The cover extension according to claim 1, wherein a rear face of the bottom flange is continuous with the rear face of the panel member.

7. The cover extension according to claim 1, wherein the flange is slightly offset rearwardly.

8. The cover extension according to claim 1, wherein stop surface includes two spaced stop surfaces are integral to the panel member and the at least flip tab includes two flip tabs swively coupled to the panel member through two fasteners having heads retained on the front face of the panel member, wherein the two fasteners are configured to be rotated clockwise or anticlockwise.

9. A cover extension for a circuit breaker panel including an electrical box and a panel cover, the cover extension for covering an opening in a wall immediately above or below the circuit breaker panel, the cover extension comprising:
   a panel member having a top edge, a bottom edge, a left edge, and a right edge, the panel member having a front face and a rear face;
   a bottom flange that extends downwards and away from the bottom edge of the curved flange and is configured to fit behind and be engaged by the panel cover so that the panel cover secures the second edge of the panel member in place;
   a plurality of spaced brackets coupled on the rear face and near the top edge of the panel member, each of the plurality of brackets having an L-shaped profile with an upper leg and a side leg, with the upper leg pointing towards the top edge of the panel member substantially parallel to the left edge of the panel member, and with the side leg pointing towards the right edge of the panel member;
   a plurality of holes in the panel member each positioned adjacent a respective one of the brackets between the upper leg and the side leg;
   a plurality of flip tabs, each flip tab swively coupled to the panel member at a respective one of the holes r, wherein the rotation of the flip tab is limited between the upper leg and the side leg of the respective bracket; and
   a plurality of threaded fasteners each received through a respective one of the holes and engaging a respective one of the flip tabs to rotate the flip tabs to secure the second edge of the panel member in place.

10. The circuit breaker panel cover extension according to claim 9, wherein the threaded fasteners each have a head retained on the front face of the panel member and a threaded shank freely inserted into the respective hole, the flip tab having inner threads configured to threadedly engage with the threads of the shank, the flip tab extending upward and beyond the top edge of the panel member to secure the top edge of the panel member in place.

11. The circuit breaker panel cover extension according to claim 10, wherein clockwise rotation of the threaded fasteners results in vertical movement of the flip tabs closer to the panel member, and anticlockwise rotation of the threaded fasteners results in the flip tabs moving away from the panel member.

12. The circuit breaker panel cover extension according to claim 11, wherein the flip tabs can be switched between an upward engaged position by the clockwise rotation of the fastener and a sideward disengaged position by the anti-clockwise rotation of the fastener.

13. The circuit breaker panel cover extension according to claim 12, wherein upon the flip tab being rotated into the engaged position, the bracket prevents further rotation of the flip tab in the same direction, wherein further rotation of the fastener in the same direction results in the flip tab being pulled toward the rear face of the panel member by the threadedly engaged fastener and flip tab to clamp the panel member to the wall.

14. The circuit breaker panel cover extension according to claim 9, wherein the panel member has a bevel that is continuous with a rear face of the bottom flange.

15. A method for covering an opening in a wall immediately above or below a circuit breaker panel, the method comprising the steps of:
providing a circuit breaker panel cover extension comprising:
a panel member having opposite first and second edges and having a front face and a rear face,
a flange that extends away from the second edge of the panel member,
a plurality of spaced mechanical stops coupled on the rear face and adjacent the top edge of the panel member, each of the plurality of mechanical stops having at least one stop surface, and
a plurality of flip tabs each swively coupled to the panel member by a fastener having a head retained on the front face of the panel member and a threaded shank that is inserted through the panel member and threadedly engaged with the flip tab on the rear face of the panel member, wherein the fastener can be rotated clockwise and anticlockwise resulting in corresponding rotation of the flip tab between engaged and unengaged positions, wherein the rotation of the flip tab is limited by the stop surface of the mechanical stop to define the engaged position of the flip tab;
positioning the cover extension over the opening in the wall above or below the circuit breaker panel;
installing a panel cover of the circuit breaker panel, such that the flange of the cover extension is positioned behind the panel cover and secured in place; and
turning each flip tab to the engaged position by rotation of the head of the fastener for clamping the flip tab to the wall.

16. A method according to claim 14, further comprising adjusting a size of the opening in the wall, such that each mechanical stop is in adjacent to an edge of the wall defining the opening when the cover extension is placed over the opening in the wall and the flange is retained behind the panel cover.

17. The method according to claim 14, wherein the threaded shank is freely inserted through a hole in the panel member, wherein the flip tab has inner threads configured to threadedly engage with the threads of the shank, and wherein the flip tab has a length such that in the engaged position is extends beyond the first edge of the panel member.

18. The method according to claim 16, wherein rotation of the fastener results in corresponding rotation of the flip tab between the engaged and unengaged positions.

19. The method according to claim 17, wherein upon the flip tab being rotated into the engaged position, the mechanical stop prevents further rotation of the flip tab in the same direction.

20. The method according to claim 18, wherein further rotation of the fastener in the same direction results in the flip tab being pulled toward the rear face of the panel member by the threadedly engaged fastener and flip tab to clamp the panel member to the wall.

* * * * *